United States Patent
Tan et al.

(10) Patent No.: US 9,917,582 B2
(45) Date of Patent: Mar. 13, 2018

(54) POLARIZER STRUCTURE TO CONTROL CROSSTALK IN PROXIMITY SENSOR INCLUDING A COVER PHYSICALLY SEPARATES A PHOTODETECTOR FROM AN OBJECT

(71) Applicant: Avago Technologies General IP (Singapore) Pte. Ltd., Singapore (SG)

(72) Inventors: Wee Sin Tan, Singapore (SG); John Lim, Singapore (SG); Hui Ling Neo, Singapore (SG); Serene Chan, Singapore (SG); Saravanan Rani Ramamoorthy, Singapore (SG)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 157 days.

(21) Appl. No.: 14/927,711

(22) Filed: Oct. 30, 2015

(65) Prior Publication Data
US 2017/0122863 A1 May 4, 2017

(51) Int. Cl.
*G01N 21/21* (2006.01)
*H03K 17/94* (2006.01)
*G06F 3/042* (2006.01)

(52) U.S. Cl.
CPC ......... *H03K 17/943* (2013.01); *G06F 3/0421* (2013.01); *H03K 2217/94108* (2013.01); *H03K 2217/94112* (2013.01)

(58) Field of Classification Search
CPC ...... G02B 27/286; G01N 21/21; G01N 21/55; G06F 3/0421
USPC ................................................. 250/226, 225
See application file for complete search history.

(56) References Cited

U.S. PATENT DOCUMENTS

| 4,990,790 A * | 2/1991 | Yoshihara | G01N 21/21 250/225 |
| 5,726,443 A | 3/1998 | Immega et al. | |
| 8,957,491 B2 | 2/2015 | Hebert | |
| 9,036,004 B2 * | 5/2015 | Hiramoto | G03B 35/08 348/273 |
| 2010/0321476 A1 * | 12/2010 | Martinez | H04N 13/0257 348/49 |
| 2014/0197306 A1 | 7/2014 | Wang et al. | |

* cited by examiner

*Primary Examiner* — Que T Le
(74) *Attorney, Agent, or Firm* — Sheridan Ross P.C.

(57) ABSTRACT

An optical sensor, optical system, and proximity sensor are disclosed. An illustrative proximity sensor is disclosed to include a light source, a photodetector including a photo-sensitive area that receives incident light and converts the received incident light into an electrical signal, and a plurality of polarization layers stacked on the photodetector that limit light from becoming received incident light for the photo-sensitive area to light traveling toward the photodetector along a predetermined path.

20 Claims, 6 Drawing Sheets

POLARIZER STRUCTURE TO CONTROL CROSSTALK IN PROXIMITY SENSOR INCLUDING A COVER PHYSICALLY SEPARATES A PHOTODETECTOR FROM AN OBJECT

FIELD OF THE DISCLOSURE

The present disclosure is generally directed toward sensing devices and, in particular, toward optical sensing devices.

BACKGROUND

There are many different types of sensors on the market, with each having specific capabilities, uses, and shortcomings. One particular type of sensor that utilizes light to detect objects is known as a proximity sensor.

Proximity sensors typically consist of a light source and a corresponding photodetector. The photodetector of a proximity sensor includes a number of photosensitive pixels. Proximity sensing (e.g., detecting a presence or proximity of an object near the sensor) involves transmitting light via the light source and then receiving light that reflects off an object-to-be-detected at the photodetector. The types of applications in which proximity sensors are used include mobile communication devices, industrial equipment, manufacturing equipment, etc.

Many types of proximity sensors include a cover that separates the sensor from an open environment that is potentially dusty, dirty, and capable of damaging components of the proximity sensor. While the cover is a useful tool to protect the proximity sensor from certain dangers, the cover also presents challenges to the operation of the proximity sensor. In particular, small reflections from the cover may overwhelm the photodetector due to its close proximity to the photodetector as compared to the proximity of the object being detected.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

With reference now to FIGS. 1-6, an optical system 100 and various configurations of a an optical sensor that can be used within such an optical system 100 will be described in accordance with at least some embodiments of the present disclosure. It should be appreciated that any aspect of any optical sensor configuration can be used in combination with or in lieu of any other aspect of other optical sensor configurations described herein. For instance, aspects of the optical sensor configuration depicted in FIGS. 4A and/or 4B may be utilized in combination with or in lieu of aspects of the optical sensor configuration depicted in FIG. 6 (or any other configuration described herein).

Figure 1:
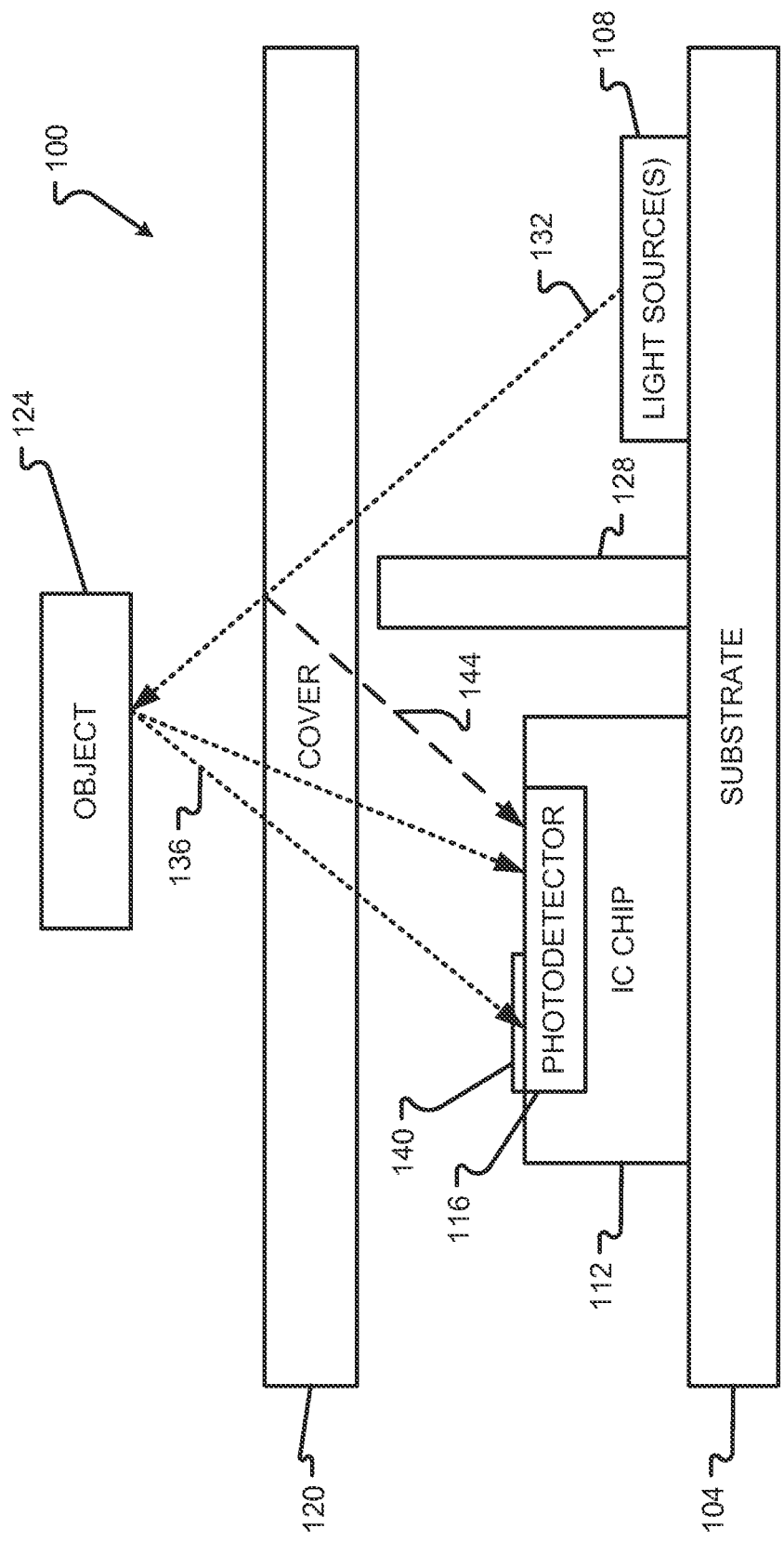
FIG. 1 depicts a block diagram of an optical system in accordance with embodiments of the present disclosure.

Referring initially to FIG. 1, details of the optical system 100 will be described in accordance with at least some embodiments of the present disclosure. The optical system 100 is shown to include a substrate 104 on which an Integrated Circuit (IC) chip 112, one or more light source 108, and a light barrier 128 are mounted. It should be appreciated that the substrate 104 may be divided into multiple substrates and each portion of the substrate 104 may support different components. Although not depicted, the substrate 104 may also physically support or be directly connected to a cover 120 that is used to protect the IC chip 112, light source(s) 108, and/or substrate 104 from environmental conditions. In some embodiments, the cover 120 may correspond to a piece of glass, sapphire, or plastic that is substantially transparent or semi-transparent to emitted light 132 produced by the light source(s) 108. In some embodiments, the cover 120 may be manufactured separately and connected to the substrate 104 of the light barrier 128 (which may be in the form of a shield of enclosing metal structure). In some embodiments, the cover 120 is substantially parallel to the top surface of the substrate 104, although such a configuration is not required. In addition to providing protection to the components mounted to the substrate 104, the cover 120 also provides a possible interaction surface for an object 124 to interact with the sensor.

The substrate 104 may include any type of object or collection of objects capable of physically supporting the light source(s) 108 and/or IC chip 112. The substrate 104 may also include elements that enable current to pass between objects mounted thereto. As an example, the substrate 104 may include a Printed Circuit Board (PCB) or the like and the IC chip 112 and light sources 108 may be mounted to the substrate 104. Examples of technologies that may be used to connect the light source(s) 108 and/or IC chip 112 to the substrate 104 include, without limitation, thru-hole mounting technologies, surface mount technologies, flip-chip mounting technologies, or the like.

The light source(s) 108 may correspond to a single light source or a plurality of light sources. The light source(s) 108 may be configured to emit radiation of a predetermined wavelength either continuously, periodically, and/or intermittently. A driver for the light source(s) 108 (not depicted) may be used to provide a driving current to the light source(s) 108, which causes the light source(s) 108 to produced emitted light 132. The driver may employ logic to have the light source(s) 108 only emit light during a certain period of time during which proximity detection is being performed by the IC chip 112. When proximity detection is not being performed (e.g., if ambient light detection is being performed instead or if no detection is currently being performed to save battery life), the driver for the light source(s) 108 may not transmit a drive signal to the light source(s) 108, thereby resulting in no production of the emitted light 132. Examples of suitable light source(s) 108 include, without limitation, a Light Emitting Diode (LED), a collection of LEDs, a laser diode, a collection of laser diodes, or any other solid-state light-emitting device. As a non-limiting example, if multiple light sources 108 are used, then two or more of the different light sources 108 may be configured to emit light of the same characteristics (e.g., color, wavelength, frequency, etc.) or light of different characteristics.

The IC chip 112 may include any type of known digital processing components (e.g., transistors, logic gates, latches, etc.). In some embodiments, the IC chip 112 may include its components in a silicon format. The photodetector 116 may correspond to an optically sensitive set of pixels established on or in the IC chip 112 in an array or the like. For example, the photodetector 116 may correspond to an array of photo-sensitive pixels established across the exposed surface of the IC chip 112 (e.g., the surface facing away from the substrate 104). The photodetector 116 may be configured to convert incident light into electrical signals that are transferred to other components of the IC chip 112, processed, and eventually results in the IC chip 112 producing an output via one or more of its leads that are connected to the substrate 104. In accordance with at least some embodiments, a portion of the photodetector 116 area may be covered with a polarizer structure 140 or the like. The polarizer structure 140 may correspond to a layer or plurality of layers of material deposited directly onto the photodetector 116. The polarizer structure 140 may, in some embodiments, correspond to a pre-fabricated structure that is attached or adhered to the photodetector 116 or IC chip 112.

As will be discussed in further detail herein, the polarizer structure 140 may be configured to allow only light 136 traveling a predetermined path to impact the portion of the photodetector 116 covered thereby. Other light 144 that does not travel the predetermined path may be blocked or otherwise rejected by the polarizer structure 140. In particular, the polarizer structure 140 may be configured to allow light 136 that has reflected from an object 124 to travel to the photodetector 116 whereas the polarizer structure 140 may substantially prohibit light 144 that has reflected off the cover 120 from impacting the photodetector 116. Since some of the photodetector 116 may receive the other light 144 that reflects from the cover 120 in addition to receiving light 136 that reflects from an object 124, the signals from the different portions of the photodetector 116 (e.g., those portions covered by the polarizer structure 140 and those portions not covered by the polarizer structure 140) may be compared, subtracted, or otherwise analyzed to account for the cover's 120 contribution to the overall signal received at the photodetector 116.

In some embodiments, light received by the portion of the photodetector 116 not covered by the polarizer structure 140 may result in the creation of a first electrical signal that is provided to a first set of processing components in the IC chip 112. On the other hand, light received by the portion of the photodetector 116 covered by the polarizer structure 140 may result in the creation of a second electrical signal that is provided to a second set of processing components in the IC chip 112 that are different from the first set of processing components that receive the first electrical signal. These different electrical signals can be compared, subtracted, or otherwise analyzed in a comparative fashion to: (1) detect a presence of the object 124 in proximity to the sensor and/or (2) determine a contribution of the cover 120 to the overall signal received at the photodetector 116.

As can be appreciated, the barrier 128 may be configured to minimize cross-talk between the light source(s) 108 and the photodetector 116. In particular, the barrier 128 may be configured to limit or minimize the emitted light 132 from travelling directly to the photodetector 116, thereby resulting in false object readings by the IC chip 112. As shown in FIG. 1, however, when a cover 120 is positioned over the barrier 128, even if in direct contact with the barrier 128, there may still be a possibility of cross-talk due to the reflective nature of the cover 120. Specifically, FIG. 1 shows how emitted light 132 can reflect from either a top or bottom surface of the cover 120 and impact the photodetector 116. It can be seen, however, that the angle of incidence for the reflected light 144 is shallower than the angle of incidence for light that impacts the object 124 and reflects 136. This is because the object 124 is positioned further away from the light source(s) 108 and photodetector 116 than the cover 120. It is, therefore, one function of the polarizer structure 140 to help determine the effects of cross-talk or reduce the effects of cross-talk by prohibiting the other light 144 reflecting from the cover 120 from reaching the photodetector 116 positioned underneath the polarizer structure 140.

The cover 120, as will be discussed in further detail herein, may be substantially transparent or semi-transparent to light emitted by the light source(s) 108. In some embodiments, the emitted light 132 produced by the light source(s) 108 may correspond to infrared light or light of some other wavelength not visible to the naked human eye. The cover 120 may be made of glass, sapphire, plastic, or the like.

Figure 2:
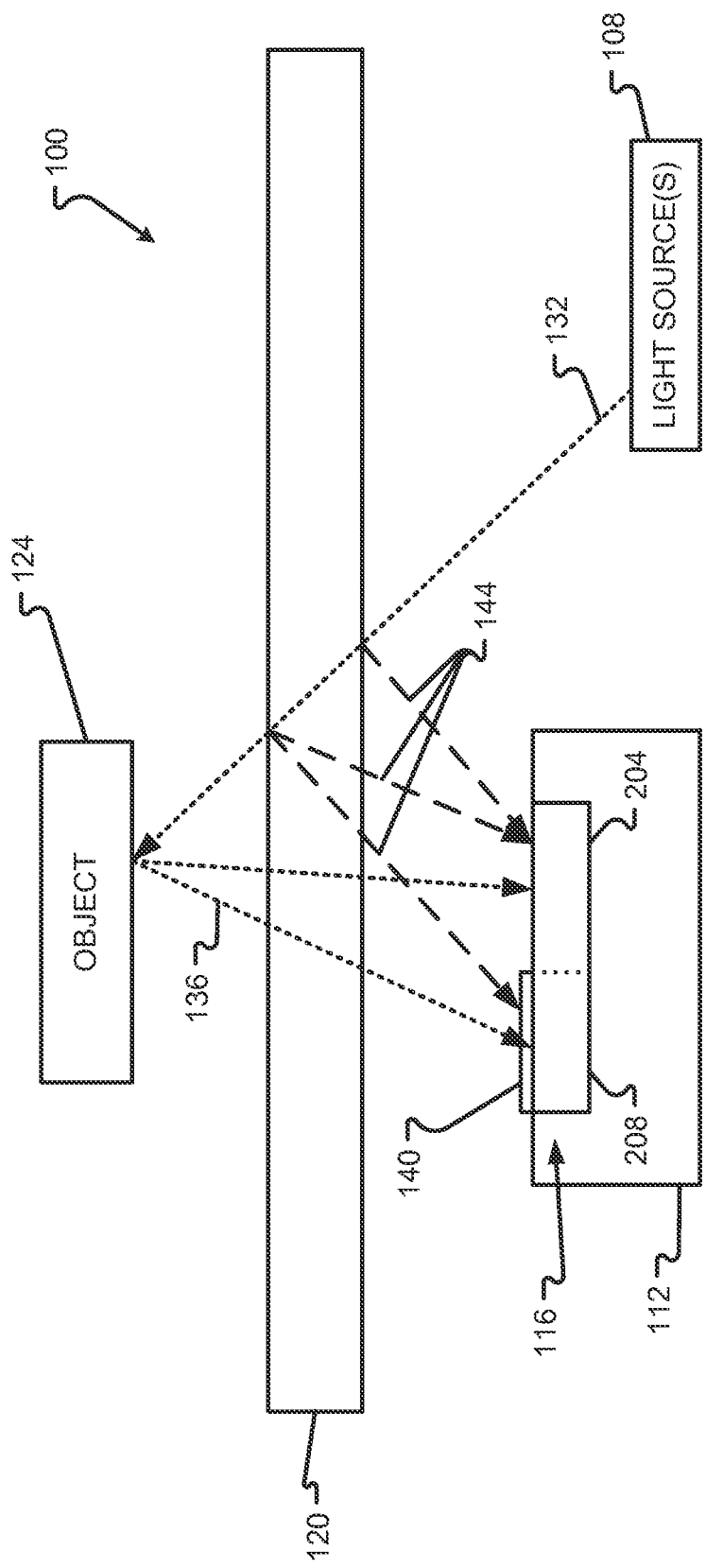
FIG. 2 is a block diagram depicting additional optical details of the optical system from FIG. 1.

With reference now to FIG. 2, additional details of the photodetector 116 and polarizer structure 140 will be described in accordance with at least some embodiments of the present disclosure. The photodetector 116 is shown to include a first photo-sensitive or photodetecting portion 204 (e.g., first PD portion) and a second photo-sensitive or photodetecting portion 208 (e.g., second PD portion). As discussed above, the first PD portion 204 may correspond to an area of the photodetector 116 that is not covered by the polarizer structure 140 and, therefore, receives both light 136 reflecting from the object 124 and light 144 reflecting from one or more surfaces of the cover 120. The barrier 128 is not shown in FIG. 2 for ease of discussion and clarity, but it should be appreciated that the barrier 128 may still be present between the light source(s) 108 and photodetector 116 to limit cross-talk.

The second PD portion 208 is shown as being positioned further away from the light source(s) 108 as compared to the first PD portion 204, but it should be appreciated that such a configuration is not required. It may be desirable, however, to position the second PD portion 208 further away from the light source(s) 108 so as to create a larger difference in angles of incidence between the reflected light 136 and reflected light 144 with respect to the surface of the second PD portion 208.

The second PD portion 208 corresponds to the area of the photodetector 116 covered by the polarizer structure 140. The polarizer structure 140 helps to limit the type of light incident on the second PD portion 208. In particular, the polarizer structure 140 may be configured to limit the light incident on the second PD portion 208 to light that has traveled a predetermined path (e.g., traveled from the light source(s) 108, to the object 124, and then to the second PD portion 208. The polarizer structure 140 may be configured to limit the incident light to any light that arrives at the surface of the second PD portion 208 with a predetermined angle of incidence. The predetermined angle of incidence may be controlled by the configuration of the polarizer structure 140 as will be discussed in further detail herein. As a non-limiting example, the polarizer structure 140 may limit the incident light for the second PD portion 208 to light that has an angle of incidence between 90 degrees and 45 degrees as measured from the surface of the photodetector 116. Still other embodiments may tighten the viewing angle of the second PD portion 208 to light having an angle of incidence between 90 degrees and 70 degrees. In some embodiments, the polarizer structure 140 may create a cone of acceptable incident light that is no larger than 90 degrees or even smaller (e.g., 40 degrees) depending upon the amount of cross-talk that is intended to be limited as well as the sensitivity of the photodetector 116 and the desired detection range for the object 124.

Figure 3:
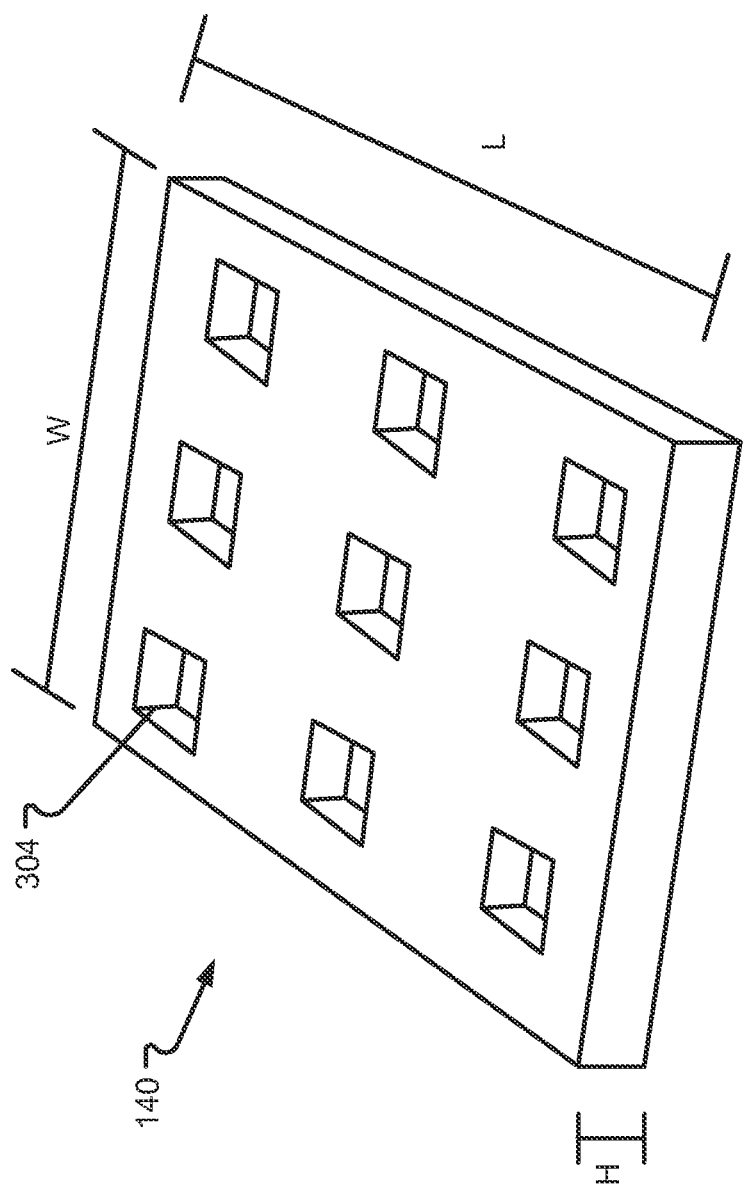
FIG. 3 is an isometric view of an illustrative polarizer structure in accordance with at least some embodiments of the present disclosure.
Figure 4A:
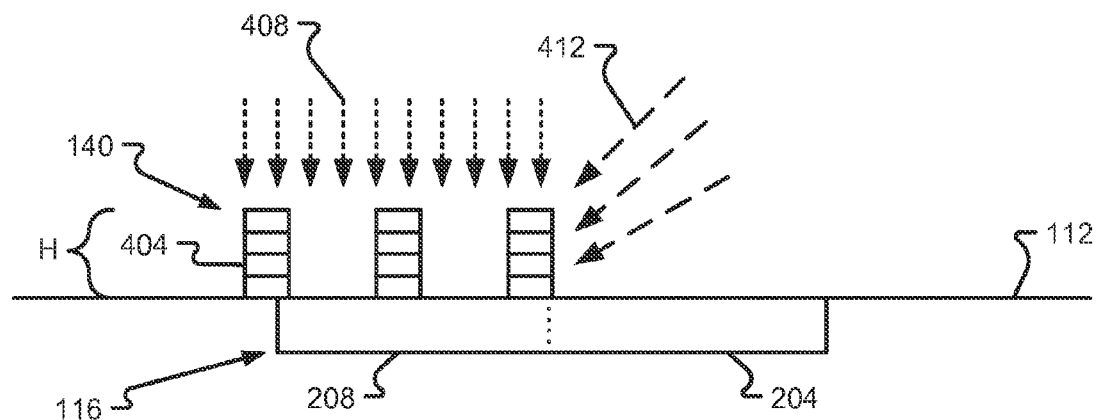
FIG. 4A depicts a cross-sectional view of a first polarizer structure configuration in accordance with at least some embodiments of the present disclosure.
Figure 4B:
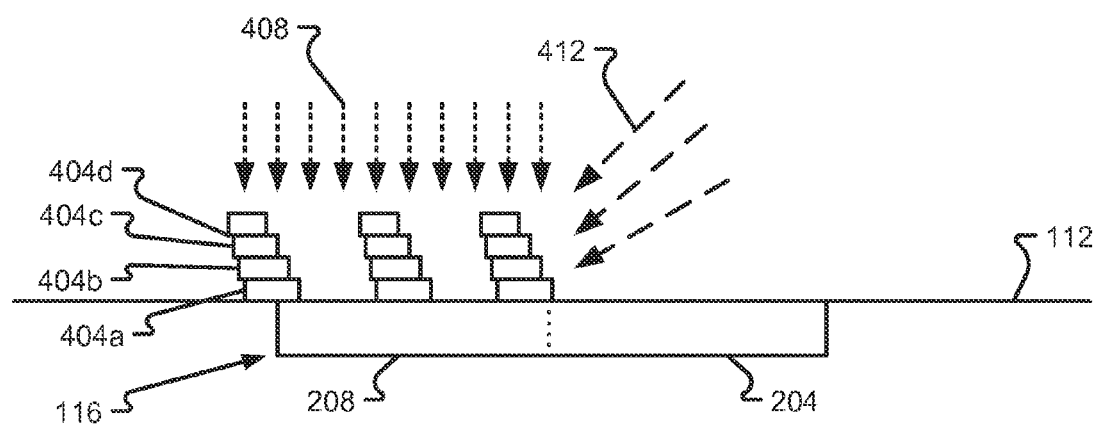
FIG. 4B depicts a cross-sectional view of a second polarizer structure configuration in accordance with at least some embodiments of the present disclosure.

With reference now to FIGS. 3-4B, various possible configurations of a polarizer structure 140 will be described in accordance with at least some embodiments of the present disclosure. The polarizer structure 140 configurations from the different figures may be combined or modified to include features of one another without departing from the scope of the present disclosure. FIG. 3 depicts a first possible configuration whereby the polarizer structure 140 includes a plurality of windows 304. The width W and length L of the polarizer structure 140 may be selected to cover a predetermined area of the photodetector 116 (e.g., all of the photodetector 116 or some but not all of the photodetector 116). The height H and the size of the windows 304, on the other hand, may be selected to control the angle of incident light allowed and not allowed to reach the second PD portion 208. In particular, a polarizer structure 304 with a relative large height H and/or smaller window 304 may be used to limit incident light for the second PD portion 208 to light hat is almost normal to the surface of the photodetector 116. On the other hand, a polarizer structure 304 with a relative small height H and/or larger window may be used to allow incident light having a greater angle of incidence.

Although FIG. 3 shows the polarizer structure 304 as having a plurality of windows 304 in the form of holes or discrete vias, it should be appreciated that other configurations of windows 304 or openings can be used without departing from the scope of the present disclosure. In particular, the openings used to limit or control the incident light may be formed as slots, gratings, pin-holes, spirals, etc. Any type of window 304 configuration can be used in the polarizer structure 140 without departing from the scope of the present disclosure.

FIGS. 4A and 4B show two possible configurations of the polarizer structure 140 in a cross-sectional view. One possible configuration, shown in FIG. 4A, depicts layers 404 of the polarizer structure 140 stacked one directly on top of another. This configuration of windows 304 having smooth walls and uniform opening widths may correspond to a simple-to-manufacture configuration of the polarizer structure 140. In some embodiments, the discrete layers 404 of the polarizer structure 140 may be stacked directly one on top of another to limit light 412 having a shallow angle of incidence from reaching the second PD portion 208. On the other hand, light 408 having traveled a predetermined path from the object 124 and/or having a steeper angle of incidence (e.g., between 70 degrees and 90 degrees) may be allowed to pass through the windows 304 and impact the second PD portion 208. Once the light 408 impacts the second PD portion 208, the second PD portion 208 may generate an electrical signal indicative of the incident light 408 (but not indicative of light 412).

The first PD portion 204, however, may receive both light 408 and light 412. This means that the amount of light incident on the first PD portion 204 may be greater in intensity that the light incident on the second PD portion 208 because the second PD portion 208 is not in receipt of light 412 that did not travel from the object 124 (or some other predetermined optical path). The ways in which this information can be used will be discussed in further detail with respect to FIG. 5.

FIG. 4B as compared to FIG. 4A shows a plurality of stacked layers 404a-d that are not stacked directly one on top of another. In particular, the layers 404a-d are shown as being stacked in a non-overlapping arrangement such that each window 304 (e.g., opening between stacks 404a-d) is tilted away from the light source(s) 108 and, therefore, less likely to allow light 412 from reaching the second PD portion 208. In some embodiments, the non-overlapping stacking of layers 404a-d may be slightly more difficult to accomplish, but does result in a photodetector 116 that receives less cross-talk light 412 (e.g., light that has not traveled the predetermined path to the object 124 and back) at the second PD portion 208. By receiving less cross-talk light 412, the second PD portion 208 may receive a larger majority of light 408 that has traveled the predetermined path and, therefore, the photodetector 116 may be able to further decrease the undesired effects of cross-talk as compared to the configuration of FIG. 4A. It should be appreciated, however, that either configuration or combination of configurations can be utilized without departing from the scope of the present disclosure.

In accordance with at least some embodiments, the various layers 404 (or 404a-d) may be deposited directly on the second PD portion 208 while the first PD portion 204 is covered or masked during the deposition process. In some embodiments, the layers 404 (or 404a-d) may correspond to metallic, plastic, or organize layers of material deposited on the second PD portion 208 of the photodetector 116. In other embodiments, the layers 404 (or 404a-d) may be separately constructed and then attached to the IC chip 112 in a separate manufacturing step. Although FIGS. 4A and 4B show four layers 404 as being included in the polarizer structure 140, it should be appreciated that greater or fewer layers 404 may be used.

Figure 5:
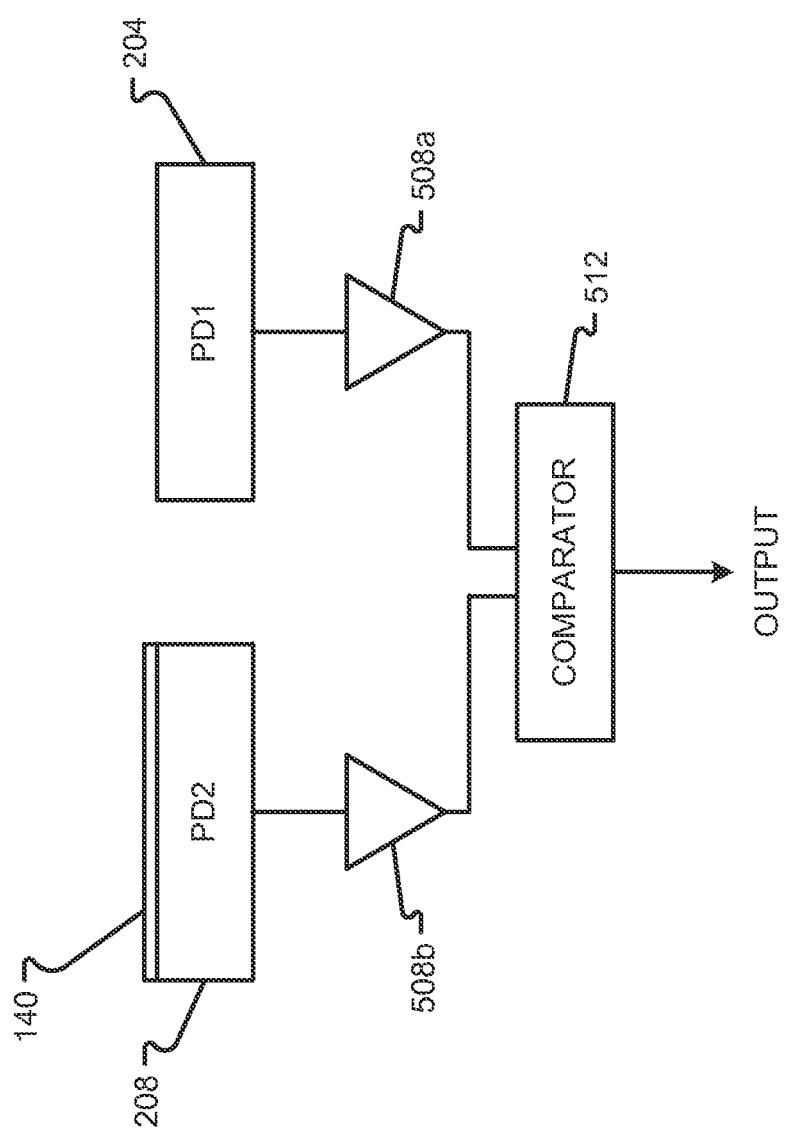
FIG. 5 is a block diagram depicting sensor circuitry in accordance with at least some embodiments of the present disclosure.

With reference now to FIG. 5, additional details of the way in which the electrical signals received from the first PD portion 204 and second PD portion 208 can be used to reduce, minimize, or signal the presence of cross-talk will be described in accordance with at least some embodiments of the present disclosure. In particular, the first PD portion 204 will receive a stronger light signal than the second PD portion 208 by virtue of the fact that the second PD portion 208 has the polarizer structure 204 provided thereon. Thus, the first PD portion 204 may generate an electrical signal indicative of all light incident at the photodetector 116, which may include cross-talk light 412 that has not traveled to the object 124. The second PD portion 208, on the other hand, may generate an electrical signal indicative of light 408, but exclusionary of light 412 that has not traveled a predetermined path. Thus, the light signal at the second PD portion 208 should be smaller in amplitude than the light signal at the first PD portion 204. However, because both portions 204, 208 may have been constructed during a common manufacturing process and are because both portions 204, 208 are integrated into the same photodetector 116 of the IC chip 112, the second PD portion 208 will produce a smaller electrical signal than the first PD portion 204 and most other variables (e.g., processing techniques, etc.) may be considered negligible to the difference between the electrical signals.

In some embodiments, the first PD portion 204 provides its electrical signal (e.g., a first electrical signal) to a first amplifier 508a, which amplifies the first signal and provides the amplified first electrical signal to a comparator 512 or similar circuitry, which may be part of the IC chip 112. The second PD portion 208 provides its electrical signal (e.g., a second electrical signal) to a second amplifier 508b, which amplifies the second signal and provides the amplified second signal to the comparator 512. The amplifiers 508a, 508b may be similar, identical, or different. Non-limiting examples of amplifiers 508a, 508b include transimpedance amplifiers, operational amplifiers, low noise amplifiers, variable gain amplifiers, etc.

The comparator 512 is used to compare or analyze the first and second amplified signals. In some embodiments, the comparator 512 may be configured to either cancel cross-talk or signal the presence of cross-talk (e.g., the presence of light 412 impacting the photodetector 116 without impacting the object 124). In particular, the comparator 512 may be configured to subtract the first amplified signal received from the first amplifier 508a from the second amplified signal received from the second amplifier 508b. The comparator 512 may then produce an output indicative of its comparison. In some embodiments, the output may correspond to a differential between the first amplified signal and the second amplified signal, thereby managing the sensor to manage cross-talk (e.g., by post-detecting processing) or at least be aware of the presence of cross-talk.

Figure 6:
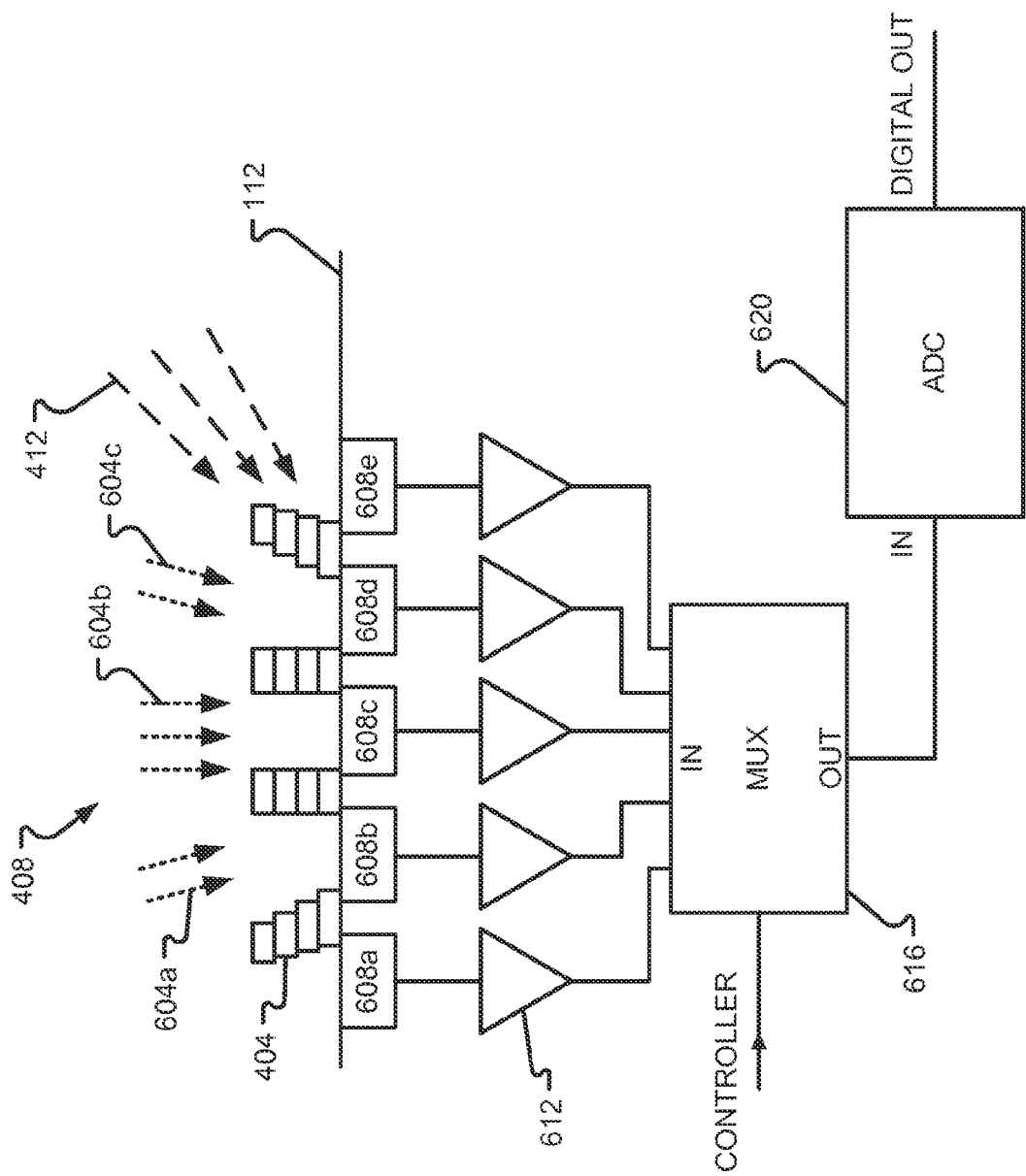
FIG. 6 is a diagram depicting a third polarizer structure configuration along with sensor circuitry to detect directional characteristics of incident light in accordance with at least some embodiments of the present disclosure.

With reference now to FIG. 6, still another possible configuration of a photodetector or optical sensor will be described in accordance with at least some embodiments of the present disclosure. This particular configuration may utilize concepts from the other disclosed configurations (and vice versa). As with other configurations described herein, the polarizer structure 140 is shown to include a plurality of layers 404 stacked on top of one another. The polarizer structure 140, in this depicted configuration, has some windows tilted whereas other windows are not tilted. Furthermore, the photodetector 116 is shown as being separated into more than two discrete portions. Specifically, the photodetector 116 is shown to include five distinct portions 608a-e. It should be appreciated that greater or fewer portions may be possible.

Some of the portions 608 of the photodetector 116 are configured to receive both light 408 and 412 (e.g., fifth portion 608e receives both types of light) whereas other portions 608a-d are provided with the polarizer structure 140 thereon. It should be appreciated that the size of the fifth portion 608e does not need to be the same as the other portions 608a-d—although such a configuration is possible and may be desirable in certain circumstances. Indeed, it may be desirable to utilize a larger photodetector portion 608 that is not covered by the polarizer structure 140. The other portions 608a-d of the photodetector 116 covered by the polarizer structure 140 may be the same size or different sizes.

The polarizer structure 140 of FIG. 6 is shown to have different configurations for each portion. In particular, layers 404 of the polarizer structure 140 may be deposited on top of the portions 608 at different angles, thereby enabling the photodetector portions 608 to have selective directional responses to light. In the example of FIG. 6, the first PD portion 608a is shown to be most blocked with respect to the cross-talk light 412 and may receive only light 408 that is travelling from an object 124 positioned behind the photodetector 116 relative to the light source(s) 108. The second PD portion 608b is configured to receive first incident light 604a that corresponds to a portion of incident light 408 impacting the photodetector 116 at a predetermined angle that may be biased away from the light source(s) 108. The third PD portion 608c is shown to have layers 404 stacked evenly thereon, which makes the second PD portion 608c responsive to a second portion of incident light 604b that is travelling at a different angle than the first portion of incident light 604a. Similarly, the fourth PD portion 604c may have its opening tilted toward the light source(s) 108, thereby making the fourth PD portion 604c responsive to a third portion of incident light 604c having an angle of incidence more directed toward the light source(s) 108. In this way, each PD portion 604a-e is responsive to light having different angles of incidence. With appropriate processing, it may become possible to sense the direction of light 408 that reaches the photodetector 116 and further differentiate that light from cross-talk light 412.

In some embodiments, each portion 608a-e provides an electrical signal representative of light reaching the PD portion 608a-e to a corresponding amplifier in an amplifier bank 612. As with the other amplifiers described herein, the amplifiers in the amplifier bank 612 may correspond to any type of known or yet to be developed amplifier or amplifier circuit.

The outputs of the amplifiers in the amplifier bank 612 are provided to a multiplexer 616, which is controlled by a controller input. The controller input for the multiplexer 616 may be provided from control logic in the IC chip 112 or from some other source. The multiplexer 616 may be configured to multiplex the various inputs and provide the multiplexed output to an analog-to-digital converter (ADC) 620, which provides a digitized version of the analog output signal generated by the multiplexer 616.

This particular configuration of FIG. 6 may be useful in situations where detection of objects 124 very close to the cover 120 is desired. In some embodiments, after assembly of the sensor, the cross-talk levels can be measured at initial testing. An object 124 may be placed directly on the cover 120 during this testing phase. The characteristics of reflected light may be measured at each of the PD portions 608a-e while the object 124 sits on the cover 120. It may then be possible to differentiate between cross-talk light 412 versus and very close objects, highly reflective objects, highly absorptive objects, and objects 124 at a normal distance. In particular, by a careful comparison of the signals from the PD portions 608a-e, the digital output of the ADC 620 can be used to substantially ignore cross-talk light 412, as well as detect bona fide objects 124 and possibly a direction or location of those objects 124 relative to the photodetector array 116.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An optical sensor, comprising:
   a photodetector comprising a photo-sensitive area that receives incident light and converts the received incident light into an electrical signal;
   a polarizer structure established on the photodetector that limits light from becoming received incident light for the photo-sensitive area to light traveling toward the photodetector along a predetermined path; and
   a cover that physically separates the photodetector from an object and that intersects the predetermined path, wherein the polarizer structure enables the photodetector to account for the cover's contribution of light to the received incident light.

2. The optical sensor of claim 1, wherein the predetermined path corresponds to a path traveled by light that reflects off the object.

3. The optical sensor of claim 2, wherein the polarizer structure is established on a first portion of the photo-sensitive area and wherein a second portion of the photo-sensitive area is not covered by the polarizer structure.

4. The optical sensor of claim 3, wherein the polarizer structure is established directly on the photodetector.

5. The optical sensor of claim 4, wherein the polarizer structure comprises a plurality of metallization layers deposited directly on the photo-sensitive area of the photodetector.

6. The optical sensor of claim 5, wherein the metallization layers are stacked substantially vertically on the photodetector.

7. The optical sensor of claim 5, wherein the metallization layers are stacked in an offset configuration on the photodetector.

8. The optical sensor of claim 7, further comprising:
   a light source that emits light toward the object, wherein the metallization layers are offset such that crosstalk induced by the cover is substantially prohibited by the metallization layers of the polarizer structure.

9. An optical system, comprising:
   a light source;
   a photodetector comprising a photo-sensitive area that receives incident light and converts the received incident light into an electrical signal;
   a polarizer structure established on the photodetector that limits light from becoming received incident light for the photo-sensitive area to light traveling toward the photodetector along a predetermined path; and
   a cover that is positioned over both the light source and the photodetector, wherein the cover separates the light source and photodetector from an object, and wherein the polarizer structure substantially prohibits light reflecting from the cover to reach the photo-sensitive area as received incident light thereby enabling the prohibition of crosstalk that is induced by the cover.

10. The optical system of claim 9, wherein the polarizer structure substantially prohibits crosstalk between the light source and photodetector.

11. The optical system of claim 10, wherein the polarizer structure is established over less than all of the photo-sensitive area of the photodetector.

12. The optical system of claim 9, wherein the polarizer structure is established directly on the photodetector.

13. The optical system of claim 12, wherein the polarizer structure comprises a plurality of metallization layers deposited directly on the photo-sensitive area of the photodetector.

14. The optical system of claim 13, wherein the metallization layers are stacked substantially vertically on the photodetector.

15. The optical system of claim 13, wherein the metallization layers are stacked in an offset configuration on the photodetector.

16. A proximity sensor, comprising:
   a light source;
   a photodetector comprising a photo-sensitive area that receives incident light and converts the received incident light into an electrical signal; and
   a plurality of polarization layers stacked on the photodetector that limit light from becoming received incident light for the photo-sensitive area to light traveling toward the photodetector along a predetermined path.

17. The proximity sensor of claim 16, wherein the plurality of polarization layers comprise metallization layers.

18. The proximity sensor of claim 16, wherein the plurality of polarization layers are stacked substantially vertically.

19. The proximity sensor of claim 16, wherein some of the plurality of polarization layers are stacked substantially vertically and wherein others of the plurality of polarization layers are stacked in an offset configuration.

20. The proximity sensor of claim 19, wherein the plurality of polarization layers that are stacked substantially vertically are positioned toward a center of the photodetector and wherein the others of the plurality of polarization layers that are stacked in the offset configuration are positioned away from the center of the photodetector.

* * * * *